(12) United States Patent
Schulz et al.

(10) Patent No.: US 10,018,759 B2
(45) Date of Patent: Jul. 10, 2018

(54) PLASTIC SUBSTRATE HAVING A POROUS LAYER AND METHOD FOR PRODUCING THE POROUS LAYER

(71) Applicant: Fraunhofer-Gesellschaft zur Förderung der angewandten Forschung e.V., Munich (DE)

(72) Inventors: Ulrike Schulz, Jena (DE); Peter Munzert, Jena (DE); Matthias Fahland, Dresden (DE); Waldemar Schoenberger, Dresden (DE)

(73) Assignee: Fraunhofer-Gesellschaft zur Förderung der angewandten Forschung e.V., München (DE)

( * ) Notice: Subject to any disclaimer, the term of this patent is extended or adjusted under 35 U.S.C. 154(b) by 105 days.

(21) Appl. No.: 15/291,851

(22) Filed: Oct. 12, 2016

(65) Prior Publication Data
US 2017/0031070 A1 Feb. 2, 2017

Related U.S. Application Data

(62) Division of application No. 13/741,147, filed on Jan. 14, 2013, now Pat. No. 9,499,902.

(30) Foreign Application Priority Data

Jan. 13, 2012 (DE) .................. 10 2012 100 288

(51) Int. Cl.
| | |
|---|---|
| *C23C 14/00* | (2006.01) |
| *G02B 5/28* | (2006.01) |
| *C23C 14/48* | (2006.01) |
| *C23C 14/02* | (2006.01) |
| *G02B 1/11* | (2015.01) |

(52) U.S. Cl.
CPC .............. *G02B 5/28* (2013.01); *C23C 14/021* (2013.01); *C23C 14/48* (2013.01); *G02B 5/282* (2013.01); *G02B 1/11* (2013.01); *G02B 2207/107* (2013.01); *Y10T 428/249961* (2015.04)

(58) Field of Classification Search
CPC ........................... C23C 14/022; C23C 14/221
USPC ....................................... 438/336; 204/192.1
See application file for complete search history.

(56) References Cited

U.S. PATENT DOCUMENTS

| | | |
|---|---|---|
| 7,238,631 B2 | 7/2007 | Moser |
| 2002/0020053 A1 | 2/2002 | Fonash et al. |
| 2007/0068794 A1 | 3/2007 | Lippey et al. |
| 2009/0011217 A1 | 1/2009 | Ottermann et al. |
| 2009/0127098 A1 | 5/2009 | Sasaki |
| 2009/0246514 A1 | 10/2009 | Chiu et al. |

FOREIGN PATENT DOCUMENTS

| | | |
|---|---|---|
| WO | 2004029323 A1 | 4/2004 |
| WO | 2007031317 A2 | 3/2007 |

*Primary Examiner* — Timon Wanga
(74) *Attorney, Agent, or Firm* — Slater Matsil, LLP

(57) ABSTRACT

A plastic substrate having a porous layer is disclosed. In an embodiment, the porous layer is formed at least partially from a material of the plastic substrate and has pores. The proportion by volume of pores is greater in a first region of the porous layer than in a second region of the porous layer. The second region follows the first region, as seen proceeding from the plastic substrate. The porous layer can be produced by a plasma process that simultaneously effects structuring of the plastic substrate by ion bombardment and coating of the plastic substrate.

8 Claims, 2 Drawing Sheets

PLASTIC SUBSTRATE HAVING A POROUS LAYER AND METHOD FOR PRODUCING THE POROUS LAYER

CROSS-REFERENCE TO RELATED APPLICATIONS

This is a divisional application of U.S. patent application Ser. No. 13/741,147 filed Jan. 14, 2013, which claims priority to German Patent Application 10 2012 100 288.6, which was filed Jan. 13, 2012, both of which are incorporated herein by reference.

TECHNICAL FIELD

The invention relates to a plastic substrate having a porous layer on a surface and to a method for producing the porous layer on the plastic substrate.

BACKGROUND

The coating of plastic substrates, in particular flexible plastic substrates, with relatively hard and brittle layer materials, such as, e.g., oxides or nitrides, is affected by the difficulty that the plastic substrate can buckle owing to mechanical stresses. This can have the effect that the applied layer is detached partially or even completely from the substrate. In order to reduce this problem, it is possible to firstly apply an adhesion-promoting layer to the plastic substrate before the application of further layers. However, this requires an additional method step.

A further possible way to improve the adhesion of layers on plastic substrates consists in mechanically roughening the plastic substrate before the layers are applied. This generally has a negative effect on the optical properties, however, with it being possible for the transmission to be adversely affected particularly in the case of optical elements made of plastic.

SUMMARY

Embodiments of the invention specify a plastic substrate which makes it possible for further layers, in particular optically active layers, to be applied with small degrees of tension. In particular, the plastic substrate should already have reduced reflection without the application of further layers. Furthermore, the intention is to specify a method with which the plastic substrate can be produced with relatively little outlay.

According to at least one configuration, the plastic substrate has a porous layer on a surface, wherein the porous layer is formed at least partially from a material of the plastic substrate and has pores, the proportion by volume of which is greater in a first region of the porous layer than in a second region of the porous layer, wherein the second region follows the first region, as seen proceeding from the plastic substrate.

In other words, the porous layer on the plastic substrate has a first region, of the volume of which the pores have a greater proportion than at a second region at a greater distance from the substrate than the first region. The greater proportion by volume of the pores in the vicinity of the substrate has the advantage that mechanical stresses can be effectively reduced in this region. This is particularly advantageous when further layers are applied to the porous layer. The smaller proportion by volume of the pores in the second region simplifies the application of further layers to that side of the porous layer which faces away from the plastic substrate.

The porous layer preferably has a thickness of between 50 nm and 500 nm. In this thickness range, the porous layer is firstly thick enough to be able to effectively reduce mechanical stresses, but secondly is not so thick that the porous layer could itself possibly become unstable.

A lateral extent of the pores on average is preferably between 20 nm and 200 nm. Pores of this type can be produced by the plasma process explained in further detail herein below and are advantageously smaller than the wavelength of visible light. The pores are therefore advantageously not visible, but rather have the effect that the porous layer has an effective refractive index lying between the refractive index of a solid phase of the porous layer and the refractive index of the pores, which contain air, for example.

The porous layer advantageously has such a porosity that the first region is formed to an extent of at most 70% by volume from the material of the plastic substrate. It is preferable that the first region is formed to an extent of at most 50% by volume from the material of the plastic substrate.

On account of the embedded pores, the porous layer may in particular have an effective refractive index which is lower than the refractive index of homogeneous layers made of the materials conventionally used for optical coatings, for example oxides, nitrides or fluorides. By way of example, the porous layer can have an effective refractive index $n<1.3$. On account of the low effective refractive index of the porous layer, the plastic substrate advantageously already has reduced reflection compared to the uncoated plastic substrate without the application of further optically active layers.

According to one configuration, the first region of the porous layer has a lower effective refractive index than the second region of the porous layer. This may be caused in particular by the fact that the pores have a greater proportion by volume in the first region than in the second region. The effective refractive index in the porous layer is advantageously not constant in a direction perpendicular to the plastic substrate. Instead, the effective refractive index in this direction has a gradient, with the effective refractive index increasing with an increasing distance from the plastic substrate.

In a preferred configuration, the plastic substrate is a flexible plastic substrate. In particular, the plastic substrate may be a film, e.g., a lamination film with a heat-shield function or photocatalytic function. Such films are used, for example, in the field of architecture or for automotive construction. The porous layer advantageously makes it possible to apply further layers to a flexible plastic substrate, in particular a film, with the mechanical stresses between the further applied layers and the plastic substrate being smaller than in the case of direct application of the further layers to the plastic substrate.

In a preferred configuration, at least one further layer is applied to the porous layer. The at least one further layer may be in particular an optically active layer. The porous layer and the at least one further layer may form in particular an optical interference layer system. The optical interference layer system formed from the porous layer and the at least one further layer may be, for example, an antireflection coating. Furthermore, the optical interference layer system may also be an optical filter, by which the spectral transmission and reflection of the coated plastic substrate are set in a targeted manner. The spectral profile of the transmission and reflection of the optical interference layer system made of the porous layer and further layers can be determined, for example, by a computer simulation, in which the optical effect of the porous layer in the form of an effective refractive index which varies in the direction perpendicular to the plastic substrate is taken into consideration.

The effective refractive index of the porous layer and the variation thereof in the direction perpendicular to the substrate can be influenced by the process parameters during the production of the porous layer. The possibility of the variation of the effective refractive index of the porous layer advantageously gives rise to additional design parameters for the optical interference layer system which cannot be varied in the case of conventional optical interference layer systems made of homogeneous layers. This can advantageously make it possible to achieve a desired spectral profile of the reflection and/or of the transmission with a relatively small number of layers.

The porous layer is formed from a solid phase and the pores. The solid phase of the porous layer is advantageously formed to an extent of at least 10% from the material of the plastic substrate. A further proportion of the solid phase of the porous layer is formed from a further material which is not the same as the material of the plastic substrate. It is preferable for the porous layer to comprise at least one of the materials Al, Mg, Zn, Sn, Si, Ti, C, V, Cr, Fe, Cu, In, Ag, Zr, Hf, Ta, W, Ce, a chemical compound comprising at least one of these materials or an alloy comprising at least one of these materials.

The fact that the porous layer is composed in part of the material of the plastic substrate and in part of the further material arises from the advantageous method for producing the porous layer which is described herein below.

In one configuration of the method for producing a plastic substrate having a porous layer, the porous layer is produced by means of a plasma process, which simultaneously effects structuring of the plastic substrate by ion bombardment and coating of the plastic substrate.

In the method, on the one hand a material of the plastic substrate is at least partially removed by the ion bombardment. The material removal is preferably locally inhomogeneous so that structures which form the pores arise in the plastic substrate.

The ion bombardment of the plastic substrate is preferably effected by negative ions, which are produced by means of a magnetic field assisted glow discharge in a process gas. The magnetic field assisted glow discharge is produced, for example, by means of a magnetron, which has an electrode and at least one magnet for generating a magnetic field. Such magnetrons are known per se and are used, for example, in magnetron sputtering systems for depositing thin layers. The method described herein can therefore advantageously be implemented in existing vacuum coating installations. The magnetron is preferably a double magnetron.

The process gas preferably has at least one electronegative constituent, such that the negative ions are produced during the magnetic field assisted glow discharge. The negative ions, which are produced on the surface of the electrode, are accelerated in the direction of the plastic substrate by an electrical voltage applied to the electrode. The negative ions impinging on the plastic substrate bring about the ion bombardment there, which results in the material removal and the structuring of the plastic substrate resulting therefrom.

In a preferred configuration, the process gas contains at least 15% oxygen. The use of oxygen is particularly advantageous since oxygen has a particularly high electronegativity.

The coating of the plastic substrate, which takes place at the same time as the ion bombardment, is preferably effected at least partially by sputtering of a material of the electrode, which is also referred to as a target. The coating material, for example the material of the electrode, preferably comprises at least one of the materials Al, Mg, Zn, Sn, Si, Ti, C, V, Cr, Fe, Cu, In, Ag, Zr, Hf, Ta, W, Ce, a chemical compound comprising at least one of these materials or an alloy comprising at least one of these materials.

In a preferred configuration of the method, after the porous layer has been produced, at least one further layer is applied to the plastic substrate. The at least one further layer may be in particular an optically active layer, which, together with the porous layer, forms an optical interference layer system.

Further advantageous configurations of the method become apparent from the preceding description of the plastic substrate, and vice versa.

BRIEF DESCRIPTION OF THE DRAWINGS

The invention will be explained in more detail herein below with reference to exemplary embodiments in conjunction with FIGS. 1 to 4, in which.

Identical component parts or component parts having an identical action are provided in each case with the same reference signs in the figures. The component parts shown and also the size relationships of the component parts among one another should not be regarded as true to scale.

DETAILED DESCRIPTION OF ILLUSTRATIVE EMBODIMENTS

Figure 1:
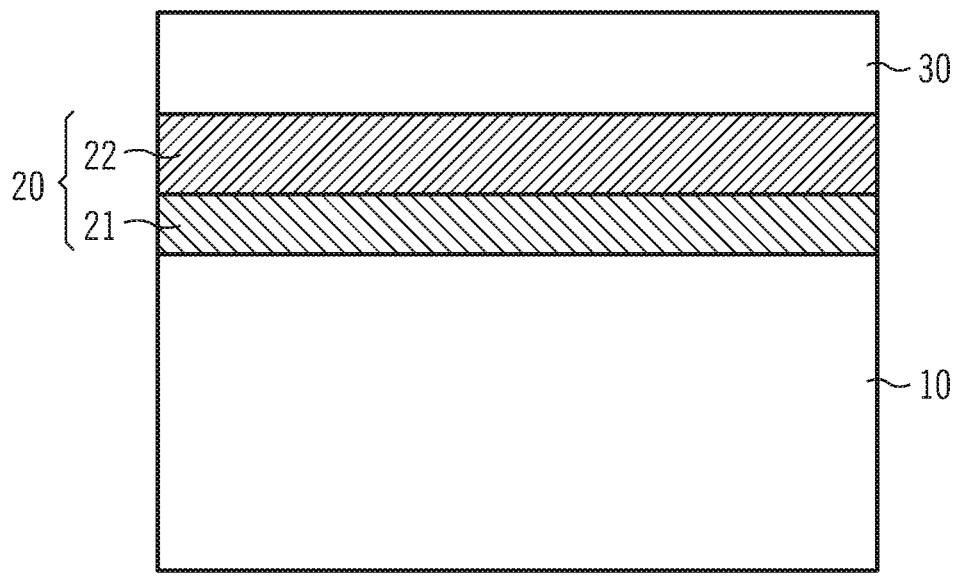
FIG. 1 shows a schematic illustration of a cross section through a plastic substrate having a porous layer according to one exemplary embodiment.

In the exemplary embodiment shown schematically in cross section in FIG. 1, a porous layer 20 is applied to a plastic substrate 10. The porous layer 20 has a first region 21 and a second region 22, the second region 22 following the first region 21, as seen proceeding from the plastic substrate 10. The second region 22 is thus at a greater distance from the plastic substrate 10 than the first region 21. The regions 21, 22 of the porous layer 20 each contain pores, the proportion by volume of the pores being greater in the first region 21 than in the second region 22. The porous layer 20 preferably has a thickness of between 50 nm and 500 nm.

At least one further layer 30 is preferably arranged on the porous layer 20. The further layer 30 may be in particular an optically active layer. The further layer 30 is, for example, an optically transparent dielectric layer, e.g., an oxide, nitride or fluoride layer. By way of example, the at least one further layer may comprise $TiO_2$ or $SiO_2$.

Together with the porous layer, the at least one further layer 30 may form, for example, an antireflection coating for the plastic substrate or an optical filter.

Instead of a single layer 30, it is possible for a plurality of further layers to be arranged on the porous layer 20, these preferably forming an optical interference layer system. The optical interference layer system can comprise in particular a plurality of oxide, nitride or fluoride layers.

The porous layer 20 arranged between the plastic substrate 10 and at least the further layer 30 advantageously reduces mechanical stresses between the plastic substrate 10 and the at least one further layer 30. This is advantageous particularly when the plastic substrate 10 is a flexible substrate, for example a film. Without the porous layer 20 between the plastic substrate and the further layer 30, there would otherwise be the risk that the further layer 30 would become damaged in the case of buckling of the plastic substrate 10, or would even become completely or partially detached from the plastic substrate 10.

In addition to this mechanical function, the porous layer 20 advantageously also has an optical function. The porous layer 20 has an effective refractive index dependent on the proportion by volume of the pores in the porous layer 20. Owing to the greater proportion by volume of the pores, the first region 21 has a lower effective refractive index than the second region 22. For the calculation of the optical action of the porous layer 20, this can be regarded approximately as a first layer 21 having a first effective refractive index $n_{eff,1}$ and a second layer 22 having a second effective refractive index $n_{eff,2} > n_{eff,1}$. In actual fact, the porous layer has a gradient of the refractive index, which is caused by the three-dimensional structure of the pores.

Figure 2:
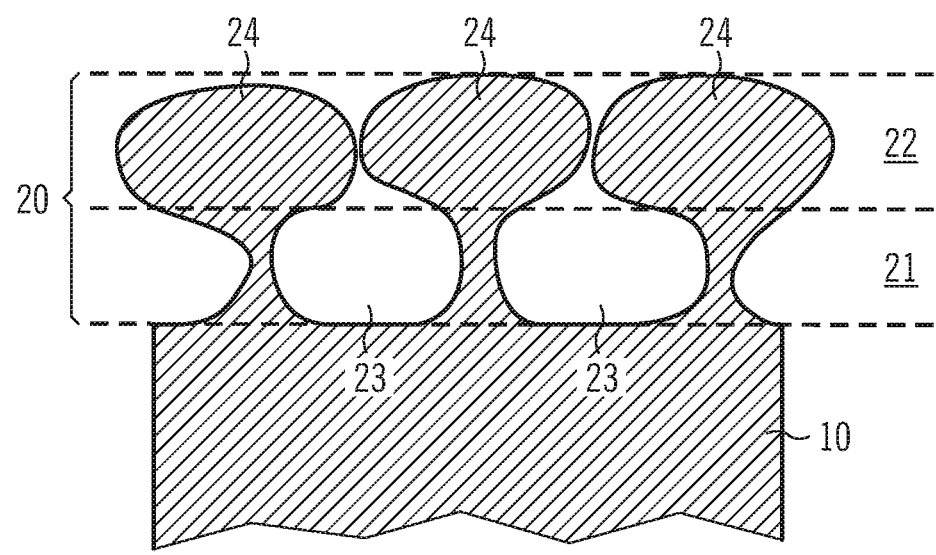
FIG. 2 shows an enlarged illustration of a section of the surface of the plastic substrate with the adjoining porous layer according to one exemplary embodiment.

An example of the three-dimensional structure of the pores 23 is illustrated in FIG. 2, which shows an enlarged illustration of a partial region of the surface of the plastic substrate 10 and of the porous layer 20 adjoining the latter. In the first region 21, in the vicinity of the surface of the plastic substrate 10, the pores 23 have a relatively large lateral extent, whereas in a region 22 lying thereabove the proportion of the solid phase 24 is larger. The effective refractive index in the direction perpendicular to the surface of the plastic substrate 10 therefore has a gradient which increases from the first region 21 toward the second region 22. The pores 23 on average preferably have a lateral extent of between 20 nm and 200 nm. The pores 23 are thus smaller than the wavelength of visible light and therefore are advantageously not visible.

The solid phase 24 of the porous layer 20 is advantageously formed to an extent of at least 10% from the material of the plastic substrate 10. Furthermore, the solid phase 24 of the porous layer 20 advantageously contains at least one of the materials Al, Mg, Zn, Sn, Si, Ti, C, V, Cr, Fe, Cu, In, Ag, Zr, Hf, Ta, W, Ce, a chemical compound comprising at least one of these materials or an alloy comprising at least one of these materials. The fact that the porous layer 20 is formed partially from the material of the plastic substrate 10 and partially from a further material is based on the method for producing the porous layer 20.

Figure 3:
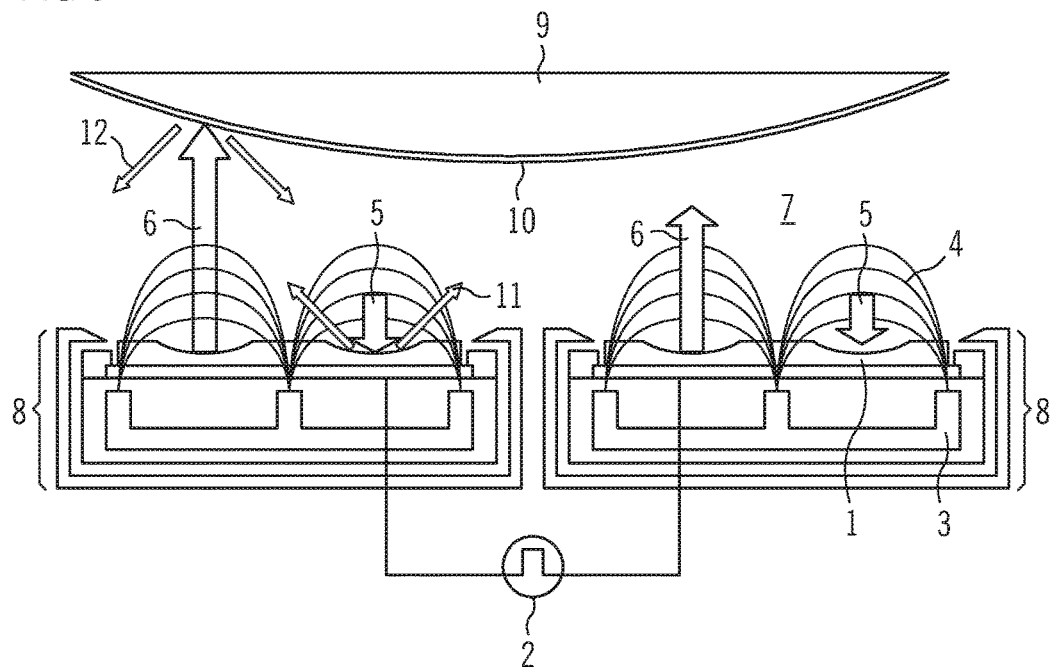
FIG. 3 shows a schematic illustration of a cross section through an apparatus for carrying out the method for producing the plastic substrate having the porous layer according to one exemplary embodiment.

The method for producing the plastic layer 10 will be explained herein below in conjunction with FIG. 3, which shows an apparatus for producing the plastic substrate having the porous layer.

The apparatus for producing the porous layer on the plastic substrate 10 has, for example, an arrangement made up of two planar magnetrons 8. The planar magnetrons 8 each comprise an electrode 1, which are connected to a medium-frequency voltage generator 2. Furthermore, the planar magnetrons 8 each contain magnets 3, which generate a magnetic field 4.

The method is carried out in a vacuum installation, into which a process gas 7 is admitted. The method is advantageously suitable for treating substrates 10 with a large surface area. By way of example, the plastic substrate 10 may be a film transported on a roller 9. As the method is being carried out, the plastic substrate 10 is preferably moved continuously past the magnetrons 8 at a distance therefrom.

In the method, a magnetic field assisted glow discharge is produced in the process gas 7 by means of the magnetron 8. In this case, a plasma is produced in the process gas 7, where the magnetic fields 4 generated by the magnets 3 should reduce diffusion of electrons from the plasma.

During the magnetic field assisted glow discharge, positive ions 5, which are accelerated in the direction of the electrodes 1, are firstly produced in the process gas 7. The positive ions 5 are, for example, ions of a noble gas present in the process gas 7. The process gas 7 may contain argon, for example.

In the method described herein, the process gas 7 contains at least one electronegative constituent. The electronegative constituent is preferably oxygen. The process gas 7 preferably comprises at least 15% oxygen. Alternatively, the process gas 7 may contain, for example, fluorine or chlorine as the electronegative constituent. Oxygen, fluorine and chlorine are distinguished by particularly high values of electronegativity. Since the process gas 7 contains at least one electronegative constituent, negative ions 6 form during the magnetic field assisted glow discharge. Some of the negative ions 6 are formed in the plasma. These negative ions generally have relatively low energies and therefore generally cannot leave the plasma. Further negative ions 6 are produced at the surface of the electrodes 1. These negative ions 6 are accelerated in the direction of the plastic substrate 10 by an electrical voltage of preferably more than one hundred volts and, in the method, advantageously serve to modify the surface of the plastic substrate 10. The negative ions 6 impinging on the plastic substrate 10 partially remove the material of the plastic substrate 10 by virtue of the fact that particles 12 are driven out from the plastic substrate. This material removal is locally inhomogeneous and produces structures in the plastic substrate 10 which form the pores.

At the same time, the positive ions 5 produced in the plasma are accelerated in the direction of the electrode 1, where they drive out particles 11 of the electrode material, which are deposited on the plastic substrate 10. This process is known per se as sputtering.

The porous layer is thus produced by means of a plasma process which simultaneously effects structuring of the plastic substrate 10 by bombardment with ions 6 and coating of the plastic substrate 10 by sputtering of the material of the electrode 1.

After the porous layer 20 has been produced, in the method it is advantageous for at least one further layer to be applied to the plastic substrate 10. This may be effected by means of known coating methods, such as for example magnetron sputtering, thermal evaporation or electron beam evaporation.

Figure 4:
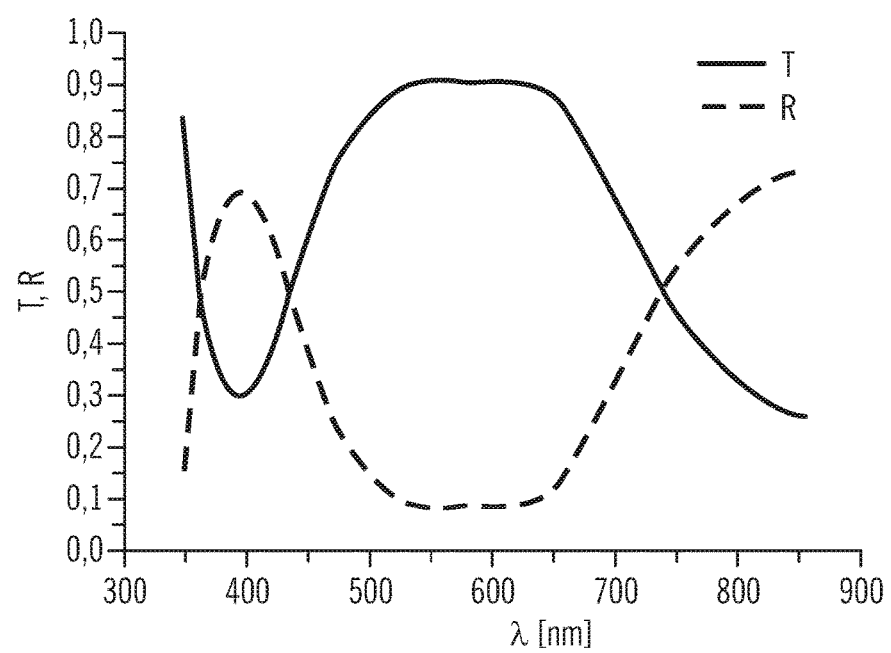
FIG. 4 shows a graphical illustration of the transmission and the reflection of an IR filter, which comprises a plastic substrate having a porous layer according to one exemplary embodiment.

FIG. 4 shows the calculated transmission and reflection of an IR filter formed from the plastic substrate 10, a porous layer 20 applied thereto and a further layer 30, which is a layer of $TiO_2$ having a thickness of 145 nm. The IR filter advantageously has a high transmission and a low reflection in the visible range, and is therefore suitable in particular for a transparent optical element. In the infrared spectral range, by contrast, the filter has a relatively high reflection and only a low transmission. The IR filter can therefore have a heat-shield function, for example. The plastic substrate 10 may be, for example, a lamination film, which can be applied for example to panes for applications in architecture or in automotive construction. Such an IR filter can be produced by the method described herein in a relatively simple manner and with relatively few layers. Comparative calculations show that a comparable optical action would be achievable with a layer system of five layers produced by means of magnetron sputtering with an overall thickness of approximately 600 nm. The IR filter shown in FIG. 4, by contrast, advantageously has only the porous layer and the one further layer of $TiO_2$ on the plastic substrate.

The invention is not restricted by the description on the basis of the exemplary embodiments. Instead, the invention encompasses any novel feature and also any combination of features, which includes, in particular, any combination of features in the patent claims, even if this feature or this combination itself is not explicitly specified in the patent claims or exemplary embodiments.

What is claimed is:

1. A plastic substrate comprising:
   a porous layer on a surface,
   wherein the porous layer is formed at least partially from a material of a plastic substrate and has pores,
   wherein a proportion by volume of the pores is greater in a first region of the porous layer than in a second region of the porous layer,
   wherein the first region is located between the second region and the plastic substrate,
   wherein the porous layer has a thickness of between 50 nm and 500 nm,
   wherein the pores, on average, have a lateral extent of between 20 nm and 200 nm, and
   wherein a solid phase of the porous layer is formed to an extent of at least 10% from the material of the plastic substrate.

2. The plastic substrate according to claim 1, wherein the first region is formed to an extent of at most 70% by volume from the material of the plastic substrate.

3. The plastic substrate according to claim 1, wherein the first region is formed to an extent of at most 50% by volume from the material of the plastic substrate.

4. The plastic substrate according to claim 1, wherein the first region of the porous layer has a lower effective refractive index than the second region of the porous layer.

5. The plastic substrate according to claim 1, wherein the plastic substrate is a flexible plastic substrate.

6. The plastic substrate according to claim 1, further comprising a further layer overlying the porous layer.

7. The plastic substrate according to claim 6, wherein the porous layer and the further layer form an optical interference layer system.

8. The plastic substrate according to claim 1, wherein the porous layer comprises at least one material selected from the group consisting of Al, Mg, Zn, Sn, Si, Ti, C, V, Cr, Fe, Cu, In, Ag, Zr, Hf, Ta, W, Ce, a chemical compound comprising at least one of these materials or an alloy comprising at least one of these materials.

* * * * *